(12) United States Patent
Noda et al.

(10) Patent No.: US 8,692,256 B2
(45) Date of Patent: Apr. 8, 2014

(54) DISPLAY UNIT AND SUBSTRATE FOR DISPLAY UNIT

(75) Inventors: Makoto Noda, Kanagawa (JP); Iwao Yagi, Kanagawa (JP); Mao Katsuhara, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 13/550,232

(22) Filed: Jul. 16, 2012

(65) Prior Publication Data
US 2013/0026478 A1      Jan. 31, 2013

(30) Foreign Application Priority Data

Jul. 27, 2011   (JP) ................................. 2011-163918

(51) Int. Cl.
*H01L 29/04*    (2006.01)
(52) U.S. Cl.
USPC ............................................ 257/59; 349/42

(58) Field of Classification Search
USPC .............................................. 257/59; 349/42
See application file for complete search history.

(56) References Cited

U.S. PATENT DOCUMENTS

| 8,242,501 B2* | 8/2012 | Hirai ............................... 257/57 |
| 2002/0014628 A1* | 2/2002 | Koyama .......................... 257/72 |
| 2011/0079817 A1* | 4/2011 | Ohara ............................ 257/103 |

FOREIGN PATENT DOCUMENTS

JP         2009-059809        3/2009

* cited by examiner

*Primary Examiner* — David Vu
*Assistant Examiner* — Brandon Fox
(74) *Attorney, Agent, or Firm* — Sheridan Ross P.C.

(57) ABSTRACT

A display unit includes, on a substrate: a plurality of light emitting devices in which a first electrode, an organic layer including a light emitting layer, and a second electrode are respectively and sequentially layered; and a black insulating layer separating the organic layer for the every light emitting device.

16 Claims, 5 Drawing Sheets

DISPLAY UNIT AND SUBSTRATE FOR DISPLAY UNIT

CROSS REFERENCES TO RELATED APPLICATIONS

The present application claims priority to Japanese Priority Patent Application JP 2011-163918 filed in the Japan Patent Office on Jul. 27, 2011, the entire content of which is hereby incorporated by reference.

BACKGROUND

The present disclosure relates to a display unit including a display device such as an organic EL (electroluminescence) device and a liquid crystal display device and a substrate for display unit applied to such a display unit.

In general, in a display unit, high contrast in its display images is demanded. As a technique to realize such a demand, in the past, a structure in which a black matrix layer is provided for the purpose of suppressing reflection on a backplane (substrate on the opposite side of a display surface of a pair of substrates) of outside light has been known. Further, a structure in which a black matrix layer having a structure integrated with a color filter is provided for the purpose of improving color purity in addition to improving contrast has been proposed (for example, see Japanese Unexamined Patent Application Publication No. 2009-59809).

SUMMARY

However, in the existing display unit, the foregoing black matrix layer is provided on a substrate opposed to the backplane. Therefore, in bonding the backplane with the substrate on which the black matrix layer is formed, in some cases, there is a disadvantage that position precision thereof (alignment precision) is lowered. In particular, in the case where the pair of substrates is formed of a flexible substrate made of plastic or the like, dimension stability, flatness, handling characteristics, and the like thereof are lower than those of a glass substrate or the like, and therefore in that case, alignment precision thereof is easily lowered. Such lowered alignment precision results in variation of display region of each pixel. Therefore, there is a possibility that desired luminance is not obtained, leading to deterioration of display performance.

It is desirable to provide a display unit that realizes higher display performance and is simply fabricated and a substrate for display unit used for the same.

According to an embodiment of the present disclosure, there is provided a display unit including, on a substrate: a plurality of light emitting devices in which a first electrode, an organic layer including a light emitting layer, and a second electrode are respectively and sequentially layered; and a black insulating layer separating the organic layer for the every light emitting device.

In the display unit according to the embodiment of the present disclosure, the black insulating layer separating the organic layer for the every light emitting device is provided. Therefore, outside light is absorbed in the black insulating layer. Further, since it is not necessary to provide a black matrix layer on an opposed substrate, alignment is not necessitated in bonding the opposed substrate.

According to an embodiment of the present disclosure, there is provided a substrate for display unit used for a display unit together with a plurality of display devices, the substrate for display unit including: a drive circuit driving the plurality of display devices; and a black insulating layer separating a region on the drive circuit into a plurality of display regions respectively corresponding to the plurality of display devices.

In the substrate for display unit according to the embodiment of the present disclosure, the region on the drive circuit is separated into the plurality of display regions respectively corresponding to the plurality of display devices by the black insulating layer. Therefore, outside light is absorbed in the black insulating layer. Further, since it is not necessary to provide a black matrix layer on an opposed substrate, alignment is not necessitated in bonding to the opposed substrate.

According to the display unit and the substrate for display unit of the embodiments of the present disclosure, the insulating layer separating devices is black. Therefore, black level is lowered by preventing outside light reflection, and high contrast is allowed to be realized. In addition, it is not necessary to provide a black matrix layer on the opposed substrate. Therefore, the display unit and the substrate for display unit according to the embodiments of the present disclosure are allowed to be formed with relative ease.

It is to be understood that both the foregoing general description and the following detailed description are exemplary, and are intended to provide further explanation of the technology as claimed.

Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

Embodiments of the present application (hereinafter referred to as embodiments) will be hereinafter described in detail with reference to the drawings.

First Embodiment

[Whole Configuration of Display Unit]

Figure 1:
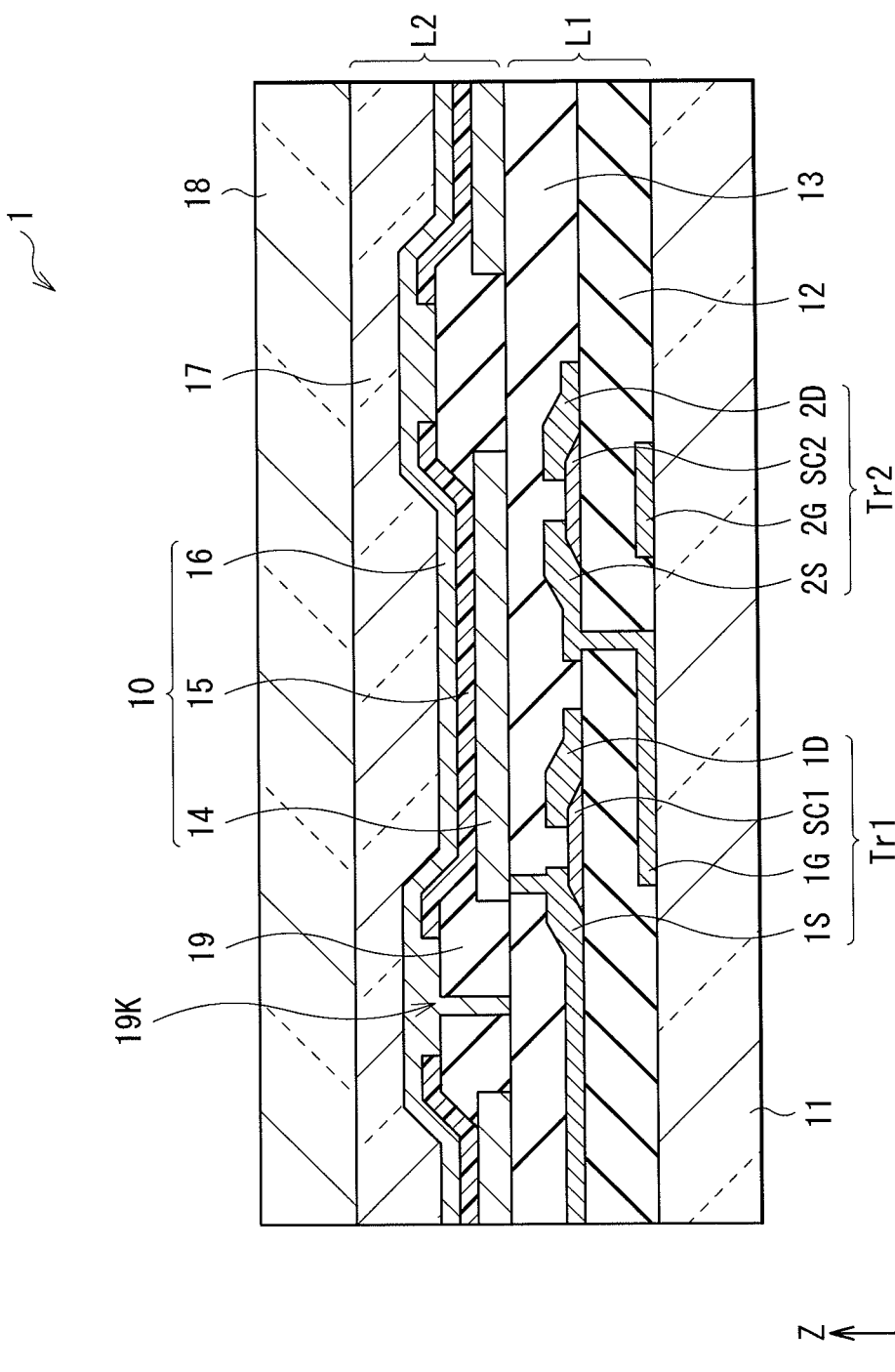
FIG. 1 is a cross-sectional view illustrating a configuration of a display unit as a first embodiment of the present application.

FIG. 1 illustrates a cross-sectional configuration of a main section of a so-called top-emission organic EL display unit 1 (hereinafter simply referred to as "display unit") including an organic light emitting device as a first embodiment of the present application. In the display unit 1, for example, a pixel drive circuit formation layer L1 including a signal line drive circuit and a scanning line drive circuit (not illustrated) for displaying images, a light emitting device formation layer L2 including an organic light emitting device 10, a sealing layer 17, and an opposed substrate 18 are sequentially layered on a supporting substrate 11. Details of the respective components will be described later.

Figure 2:
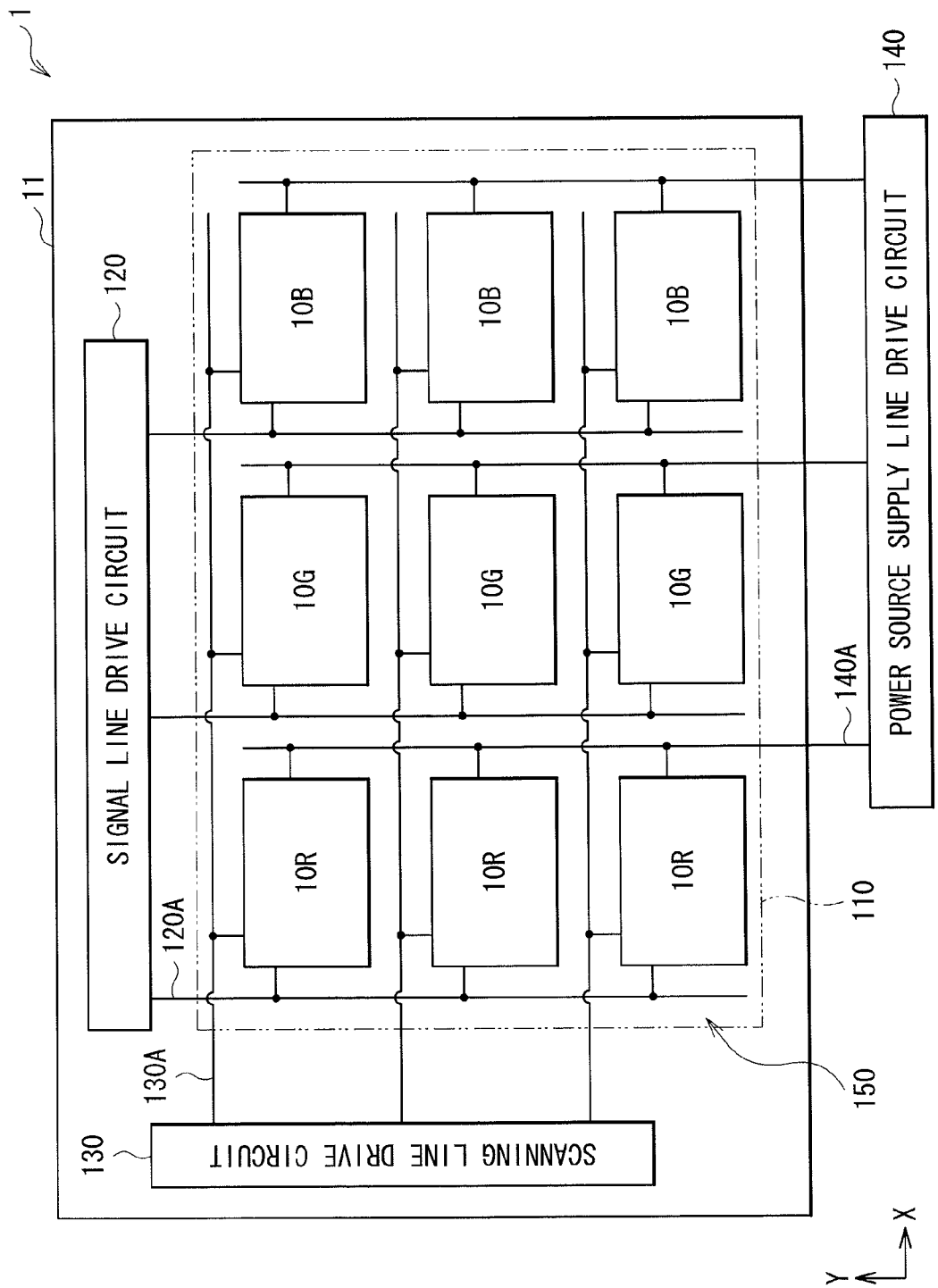
FIG. 2 is a schematic view illustrating a whole configuration of the display unit illustrated in FIG. 1.

FIG. 2 illustrates a whole configuration of the display unit 1. In the display unit 1, a display region 110 is formed on the supporting substrate 11. The display unit 1 is used as an ultrathin organic light emitting color display unit or the like. Around the display region 110 on the supporting substrate 11, for example, a signal line drive circuit 120, a scanning line drive circuit 130, and a power source supply line drive circuit 140 that are drivers used for displaying images are formed.

In the display region 110, a plurality of organic light emitting devices 10 (10R, 10G, and 10B) that are two-dimensionally arranged in a matrix state and a pixel drive circuit 150 used for driving the same are formed. The organic light emitting devices 10R, 10G, and 10B represent the organic light emitting devices 10 that emit red light, green light, and blue light, respectively. In the pixel drive circuit 150, a plurality of signal lines 120A (120A1, ... 120A2 ... 120Am ...) and a plurality of power source supply lines 140A (140A1 ... 140An ...) are arranged in the column direction (Y direction), and a plurality of scanning lines 130A (130A1 ... 130An ...) are arranged in the row direction (X direction). One of the organic light emitting devices 10R, 10G, and 10B is provided correspondingly to each intersection of each signal line 120A and each scanning line 130A. Both ends of each signal line 120A are connected to the signal line drive circuit 120, and both ends of each scanning line 130A are connected to the scanning line drive circuit 130, and both ends of each power source supply line 140A are connected to the power source supply line drive circuit 140.

The signal line drive circuit 120 is intended to supply a signal voltage of an image signal corresponding to luminance information supplied from a signal supply source (not illustrated) to organic light emitting devices 10R, 10G, and 10B selected through the signal line 120A. The signal voltage from the signal line drive circuit 120 is applied to both ends of the signal line 120A.

The scanning line drive circuit 130 is configured of a shift resistor or the like that sequentially shifts (transfers) a start pulse in synchronization with an inputted clock pulse. The scanning line drive circuit 130 is intended to scan writing of the image signal into the respective organic light emitting devices 10R, 10G, and 10B in units of row, and sequentially supply a scanning signal to each scanning line 130A. The scanning signal from the scanning line drive circuit 130 is supplied to both ends of the scanning line 130A.

The power source supply line drive circuit 140 is configured of a shift resistor or the like that sequentially shifts (transfers) the start pulse in synchronization with the inputted clock pulse. The power source supply line drive circuit 140 supplies one of a first electric potential and a second electric potential that are different from each other as appropriate to respective both ends of the respective power source supply lines 140A in synchronization with scanning in units of row by the signal line drive circuit 120. Thereby, conduction state or non-conduction state of an after-mentioned drive transistor Tr1 is selected.

Figure 3:
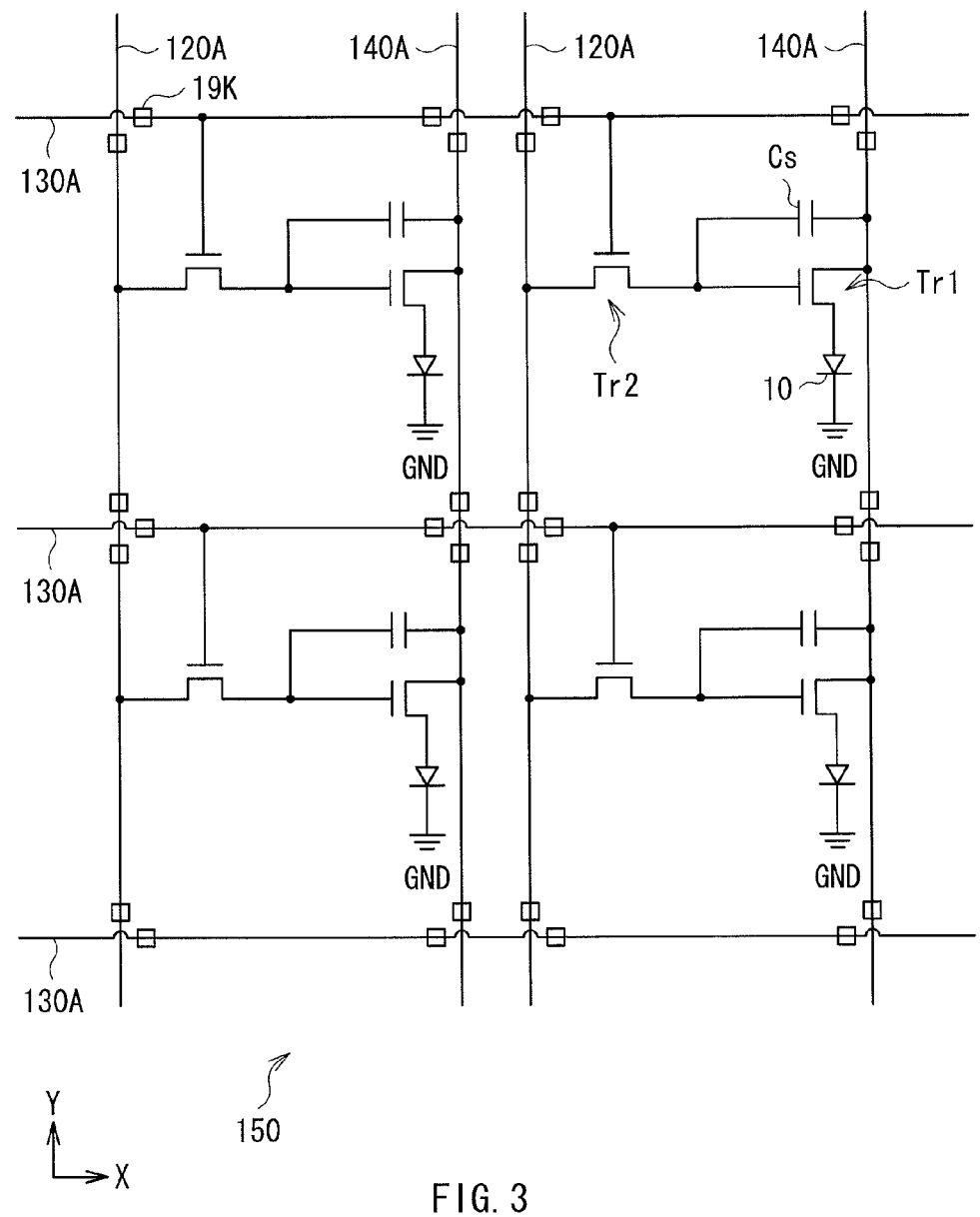
FIG. 3 is a circuit diagram illustrating an example of a pixel drive circuit illustrated in FIG. 2.

The pixel drive circuit 150 is provided in a layer between the supporting substrate 11 and the organic light emitting device 10, that is, in the pixel drive circuit formation layer L1. FIG. 3 illustrates a configuration example of the pixel drive circuit 150. As illustrated in FIG. 3, the pixel drive circuit 150 is an active type drive circuit having the drive transistor Tr1, a writing transistor Tr2, a capacitor (retentive capacity) Cs between the drive transistor Tr1 and the writing transistor Tr2, and the organic light emitting device 10. The organic light emitting device 10 is serially connected to the drive transistor Tr1 between the power source supply line 140A and a common power source supply line (GND). The drive transistor Tr1 and the writing transistor Tr2 are configured of a general thin film transistor (TFT (thin film transistor)). The configuration thereof is not particularly limited, and may be, for example, inversely staggered structure (so-called a bottom gate type) or staggered structure (top gate type).

For example, a drain electrode of the writing transistor Tr2 is connected to the signal line 120A. The image signal from the signal line drive circuit 120 is supplied to the drain electrode of the writing transistor Tr2. Further, a gate electrode of the writing transistor Tr2 is connected to the scanning line 130A. The scanning signal from the scanning line drive circuit 130 is supplied to the gate electrode of the writing transistor Tr2. Further, a source electrode of the writing transistor Tr2 is connected to a gate electrode of the drive transistor Tr1.

For example, a drain electrode of the drive transistor Tr1 is connected to the power source supply line 140A, and one of the first electric potential and the second electric potential supplied from the power source supply line drive circuit 140 is set. A source electrode of the drive transistor Tr1 is connected to the organic light emitting device 10.

The retentive capacity Cs is formed between a gate electrode 1G of the drive transistor Tr1 (source electrode 2S of the writing transistor Tr2) and a source electrode 1S of the drive transistor Tr1.

[Configuration of Main Section of Display Unit]

Next, a description will be given of detailed configurations of the supporting substrate 11, the pixel drive circuit formation layer L1, the light emitting device formation layer L2, the opposed substrate 18, and the like with reference to FIG. 1 again. Since the organic light emitting devices 10R, 10G, and 10B have a common configuration except that each configuration of an organic layer 15 (described later) is partly different, a description thereof will be hereinafter given collectively.

The supporting substrate 11 is made of, for example, glass, a plastic material, or the like capable of blocking transmission of moisture (moisture vapor) and oxygen. In a top-emission display unit, light is extracted from the opposed substrate 18. Therefore, the supporting substrate 11 may be made of a transmissive material or a non-transmissive material. In the case where the display unit 1 is a flexible display, the supporting substrate 11 is preferably made of a plastic material having flexibility.

The pixel drive circuit formation layer L1 has a laminated structure including a gate insulating film 12 and a protective layer 13. In the pixel drive circuit formation layer L1, the drive transistor Tr1 and the writing transistor Tr2 configuring the pixel drive circuit 150 are formed. Further, in the pixel drive circuit formation layer L1, the signal line 120A, the scanning line 130A, and the power source supply line 140A (not illustrated) are buried. More specifically, the gate electrode 1G of the drive transistor Tr1 and a gate electrode 2G of the writing transistor Tr2 are respectively formed on the supporting substrate 11, and are covered with the gate insulating film 12 in block. On the gate insulating film 12, semiconductor layers SC1 and SC2, the source electrodes 1S and 2S, and drain electrodes 1D and 2D in the drive transistor Tr1 and the writing transistor Tr2 are respectively formed.

The gate electrodes 1G and 2G are made of, for example, one kind, or two or more kinds of metal materials, inorganic conductive materials, organic conductive materials, and carbon materials. Examples of the metal materials include aluminum (Al), copper (Cu), molybdenum (Mo), titanium (Ti), chromium (Cr), nickel (Ni), palladium (Pd), gold (Au), silver (Ag), platinum (Pt), and an alloy containing these elements. Examples of the inorganic conductive materials include indium oxide ($In_2O_3$), indium tin oxide (ITO), indium zinc oxide (IZO), and zinc oxide (ZnO). Examples of the organic conductive materials include polyethylene dioxythiophene (PEDOT) and polystyrene sulfonate (PSS). Examples of the carbon materials include graphite. It is to be noted that the gate electrodes 1G and 2G may have a laminated structure in which two or more layers of the foregoing various materials are layered.

The gate insulating film 12 is made of, for example, one kind, or two or more kinds of inorganic insulating materials and organic insulating materials. Examples of the inorganic materials include silicon oxide ($SiO_x$), silicon nitride ($SiN_x$), aluminum oxide ($Al_2O_3$), titanium oxide ($TiO_2$), hafnium oxide ($HfO_x$), and barium titanate ($BaTiO_3$). Examples of the organic insulating materials include polyvinylphenol (PVP), polyimide, polymethacrylic acid acrylate, photoactive polyimide, a photoactive novolac resin, and polyparaxylene. It is to be noted that the gate insulating film 12 may have a laminated structure in which two or more layers of the foregoing various materials are layered.

The semiconductor layers SC1 and SC2 are made of one kind, or two or more kinds of inorganic semiconductor materials and organic semiconductor materials. Examples of the inorganic semiconductor materials include amorphous silicon. As an organic semiconductor material, acene, a derivative thereof, or the like is allowed to be used. Examples of acene include naphthacene, pentacene, hexacene, heptacene, dibenzopentacene, tetrabenzopentacene, pyrene, dibenzopyrene, chrisene, perylene, coronene, terrylene, ovalene, quaterrylene, and circumanthracene.

The source electrodes 1S and 2S and the drain electrodes 1D and 2D are made of, for example, a material similar to the foregoing materials of the gate electrodes 1G and 2G. The source electrodes 1S and 2S and the drain electrodes 1D and 2D are preferably in ohmic-contact with the semiconductor layers SC1 and SC2.

The protective layer 13 is provided mainly to planarize the surface of the pixel drive circuit formation layer L1, and is made of, for example, an insulating resin material such as polyimide. As long as sufficient flatness is obtained by the gate insulating film 12, the protective layer 13 may be omitted.

In the light emitting device formation layer L2, the organic light emitting device 10, an insulating layer 19, and the sealing layer 17 covering the organic light emitting device 10 and the insulating layer 19 are provided.

In the organic light emitting device 10, a first electrode layer 14 as an anode electrode, the organic layer 15 including a light emitting layer (not illustrated), and a second electrode layer 16 as a cathode electrode are sequentially layered from the supporting substrate 11 side. The organic layer 15 and the first electrode layer 14 are separated for every light emitting device 10 by the insulating layer 19. Meanwhile, the second electrode layer 16 is commonly provided for all the organic light emitting devices 10.

The organic layer 15 has a laminated configuration in which a hole injection layer, a hole transport layer, a light emitting layer, and an electron transport layer are sequentially layered from the first electrode 14 side. However, layers other than the light emitting layer may be provided as needed.

The hole injection layer is intended to improve electron hole injection efficiency and is a buffer layer to prevent leakage. The hole transport layer is intended to improve efficiency to transport a hole to the light emitting layer. The light emitting layer is intended to generate light due to electron-hole recombination by applying an electric field. The electron transport layer is intended to improve efficiency to transport electrons to the light emitting layer. An electron injection layer composed of LiF, $Li_2O$, or the like may be provided between the electron transport layer and the second electrode 16.

Part of component materials of the organic layer 15 varies according to light emitting colors of the organic light emitting devices 10R, 10G, and 10B. The hole injection layer of the organic light emitting device 10R is composed of, for example, 4,4',4"-tris(3-methylphenylphenylamino)triphenyl amine (m-MTDATA) or 4,4',4"-tris(2-naphthylphenylamino) triphenyl amine (2-TNATA). The hole transport layer of the organic light emitting device 10R is composed of, for example, bis[(N-naphthyl)-N-phenyl]benzidine (α-NPD). The light emitting layer of the organic light emitting device 10R is composed of, for example, a material in which 40 volume % of 2,6-bis[4-[N-(4-methoxyphenyl)-N-phenyl] aminostyril]naphthalene-1,5-dicarbonitrile (BSN—BCN) is mixed with 8-quinolinol aluminum complex ($Alq_3$). The electron transport layer of the organic light emitting device 10R is composed of, for example, $Alq_3$.

The hole injection layer of the organic light emitting device 10G is composed of, for example, m-MTDATA or 2-TNATA. The hole transport layer of the organic light emitting device 10G is composed of, for example, α-NPD. The light emitting layer of the organic light emitting device 10G is composed of, for example, a material in which 3 volume % of coumarin 6 is mixed with $Alq_3$. The electron transport layer of the organic light emitting device 10G is composed of, for example, $Alq_3$.

The hole injection layer of the organic light emitting device 10B is composed of, for example, m-MTDATA or 2-TNATA. The hole transport layer of the organic light emitting device 10B is composed of, for example, α-NPD. The light emitting layer of the organic light emitting device 10B is composed of, for example, spiro 6Φ. The electron transport layer of the organic light emitting device 10B is composed of, for example, $Alq_3$.

The insulating layer 19 is provided to fill a gap between the first electrode 14 and the organic layer 15 between adjacent organic light emitting devices 10. That is, the insulating layer 19 secures insulation of the first electrode 14 and the second electrode 16, and accurately defines a light emitting region of the organic light emitting device 10.

The insulating layer 19 is made of, for example, a material being black by dispersing a black colorant, a black dye, and a black pigment in an insulating resin material such as polyimide, that is, a material that absorbs visible light and decreases reflection. Examples of such a black pigment include one or more of the following organic colorants and the following inorganic colorants. Examples of the organic colorants include an azo lake-based colorant, an insoluble azo-based colorant, a condensed azo-based colorant, a phthalocyanine-based colorant, a quinacridone-based colorant, a dioxazine-based colorant, an isoindolinone-based colorant, an anthraquinone-based colorant, a perinone-based colorant, a thioindigo-based colorant, and a perylene-based colorant. Examples of the inorganic colorants include carbon black, titanium oxide, milori blue, cobalt purple, manganese purple, ultramarine blue, iron blue, cobalt blue, cerulean blue, and viridian. Each colorant may be used singly, or two or more thereof may be used by mixture. Further, examples of the black dye include nigrosine as an azine-based compound obtained by condensing aniline and nitrobenzene (for example, NUBIAN BLACK series available from Orient Chemical Industries Co., Ltd.) and BONJET BLACK (available from Orient Chemical Industries Co., Ltd.). Further, the insulating layer 19 is preferably formed, for example, by using a photoactive resin capable of being formed by optical patterning, reflow, or the like in order to simplify formation steps and enable formation of a desired shape thereof.

In the insulating layer 19, an opening 19K penetrating from the second electrode 16 to the protective layer 13 is provided in a predetermined position. Specifically, as illustrated in FIG. 3, a plurality of openings 19K are provided in the vicinity of each intersection of the signal line 120A, the scanning line 130A, and the power source supply line 140A. Through the opening 19K, a laser beam is allowed to be irradiated from the opposed substrate 18 side to part of a metal layer configuring the signal line 120A, the scanning line 130A, the power source supply line 140A, or the like buried in the pixel drive circuit formation layer L1.

The sealing layer 17 is made of, for example, an insulating resin material such as polyimide as the protective layer 13 is.

The opposed substrate 18 is intended to seal the organic light emitting device 10 together with the sealing layer 17, an adhesive layer (not illustrated) made of a thermoset resin, or the like. The opposed substrate 18 is made of, for example, transparent glass or a transparent plastic material that transmits light generated in the light emitting layer included in the organic layer 15.

[Method of Manufacturing Display Unit]

The display unit 1 is manufactured, for example, as follows.

First, the supporting substrate 11 made of the foregoing material is prepared. The pixel drive circuit 150 including the drive transistor Tr1 and the writing transistor Tr2 is formed on the supporting substrate 11. Specifically, first, a metal film is formed on the supporting substrate 11 by, for example, sputtering. After that, the metal film is patterned by, for example, a photolithography method, dry etching, or wet etching, and thereby the gate electrodes 1G and 2G and the signal line 120A are formed on the supporting substrate 11. Next, the gate insulating film 12 is formed to cover the whole surface by an evaporation method or the like with the use of the foregoing material. Further, the semiconductor layers SC1 and SC2, the drain electrodes 1D and 2D, and the source electrodes 1S and 2S are sequentially formed in a predetermined shape on the gate insulating film 12. At this time, a connection section through which the gate electrode 1G and the source electrode 2S are connected is previously formed in the gate insulating film 12. Further, together with the formation of the drain electrodes 1D and 2D and the source electrodes 1S and 2S, the scanning line 130A and the power source supply line 140A are respectively formed. At this time, a connection section necessary for connecting each wiring to each electrode is formed as appropriate. After that, the whole structure is covered with the protective layer 13 by a spin coating method or the like (by further performing photolithography treatment as needed), and thereby the pixel drive circuit formation layer L1 is completed. At this time, a connection hole for forming a connection section to the first electrode 14 is formed by dry etching or the like in a predetermined position on the metal layer 15 in the protective layer 13.

Further, the first electrode 14 made of the foregoing predetermined material is formed. Specifically, a metal film made of the foregoing material is wholly formed by, for example, an evaporation method or the like. After that, a resist pattern (not illustrated) in a predetermined shape is formed on the metal film by using a predetermined mask. Further, the metal film is selectively etched by using the resist pattern as a mask. At this time, the first electrode 14 is formed to cover the surface of the protective layer 13 and to fill in the foregoing connection hole.

After the first electrode 14 is formed, the insulating layer 19 is selectively formed to fill in each gap thereof. Specifically, the whole surface is coated with a positive type black resist including, for example, a black colorant by a spin coating method. After that, firing (for example, for about two minutes at about 100 deg C.), selective exposure (150 mj/cm$^2$), and development are sequentially performed, and thereby patterning is allowed to be made in a predetermined shape. At this time, the opening 19K is also formed in a predetermined position. Further, heating is performed up to about 150 deg C., the resultant is retained in such a state, and thereby an organic solvent included in the black resist is removed. At this time, for example, in the case where heating is performed in a vacuum oven, drying is allowed to be performed effectively. As described above, the opening 19K is allowed to be formed precisely by photolithography treatment. Therefore, its opening area is allowed to be kept to bare minimum.

Accordingly, a backplane (substrate for display unit) including the pixel drive circuit formation layer L1 including the thin film transistor and the black insulating layer 19 separating the region on the pixel drive circuit formation layer L1 into display regions of the plurality of organic light emitting devices 10 is completed.

Subsequently, the hole injection layer, the hole transport layer, the light emitting layer, and the electron transport layer that are made of the foregoing predetermined materials and that have predetermined thicknesses are sequentially layered by, for example, an evaporation method to totally cover an exposed section in the first electrode 14, and thereby the organic layer 15 is formed. Further, the second electrode 16 is formed over the whole surface to face the first electrode 14 with the organic layer 15 in between, and thereby the organic light emitting device 10 is completed.

After that, the sealing layer 17 made of the foregoing material is formed to cover the whole structure. Finally, the adhesive layer is formed on the sealing layer 17, and the opposed substrate 18 is bonded to the sealing layer 17 with the adhesive layer in between. Thereby, the display unit 1 is completed.

[Function and Effect of Display Unit]

As described above, in this embodiment, the insulating layer 19 that separates the organic layer 15 for every organic light emitting device 10 is made of the black material. Therefore, the following effect is obtained. That is, outside light entering from the opposed substrate 18 side is absorbed, and reflection thereof is sufficiently suppressed. Thereby, visibility of display images is allowed to be improved. By combining with a retardation film and a polarizing plate (not illustrated), outside light reflectance in the organic light emitting device 10 is allowed to be further decreased. Further, since pixel separation is made by the black insulating layer 19, mixture (color mixture) of image light of different colors from adjacent light emitting devices is allowed to be avoided. Further, differently from in the existing technologies, it is not necessary to provide a black matrix layer on the opposed substrate 18. Therefore, in bonding the opposed substrate 18 to the pixel drive circuit formation layer L1, the light emitting device formation layer L2, and the sealing layer 17 that are provided on the supporting substrate 11, a particular alignment work is not necessitated.

Further, the opening 19K is provided in a predetermined position in the insulating layer 19. Therefore, even in the case where short-circuit occurs among the signal line 120A, the scanning line 130A, and the power source supply line 140A in a manufacturing step, repair thereof is enabled. For example, in the case where short-circuit occurs in an arbitrary intersection point between the signal line 120A and the scanning line 130A, the organic light emitting device 10 on the signal line 120A and the scanning line 130A including such an intersection point with short-circuit becomes defective, and does not perform accurate light emitting operation. However, in this case, it is enough that the signal line 120A or the scanning line 130A is broken by irradiating a laser beam through the opening 19K in positions sandwiching such a location with short-circuit. Thereby, the location with short-circuit is electrically isolated, and therefore such a defect is repaired. In the case where short-circuit occurs in an arbitrary intersection point between the power source supply line 140A and the scanning line 130A, a location with short-circuit is allowed to be repaired by a similar technique. It is to be noted that such repairs are premised on a state in which respective both ends of the signal line 120A, the scanning line 130A, and the power source supply line 140A are respectively connected to the signal line drive circuit 120, the scanning line drive circuit 130, and the power source supply line drive circuit 140, and receive each signal. Further, in the same signal line 120A, the same scanning line 130A, and the same power source supply line 140A, only one location is allowed to be repaired.

Second Embodiment

Figure 4:
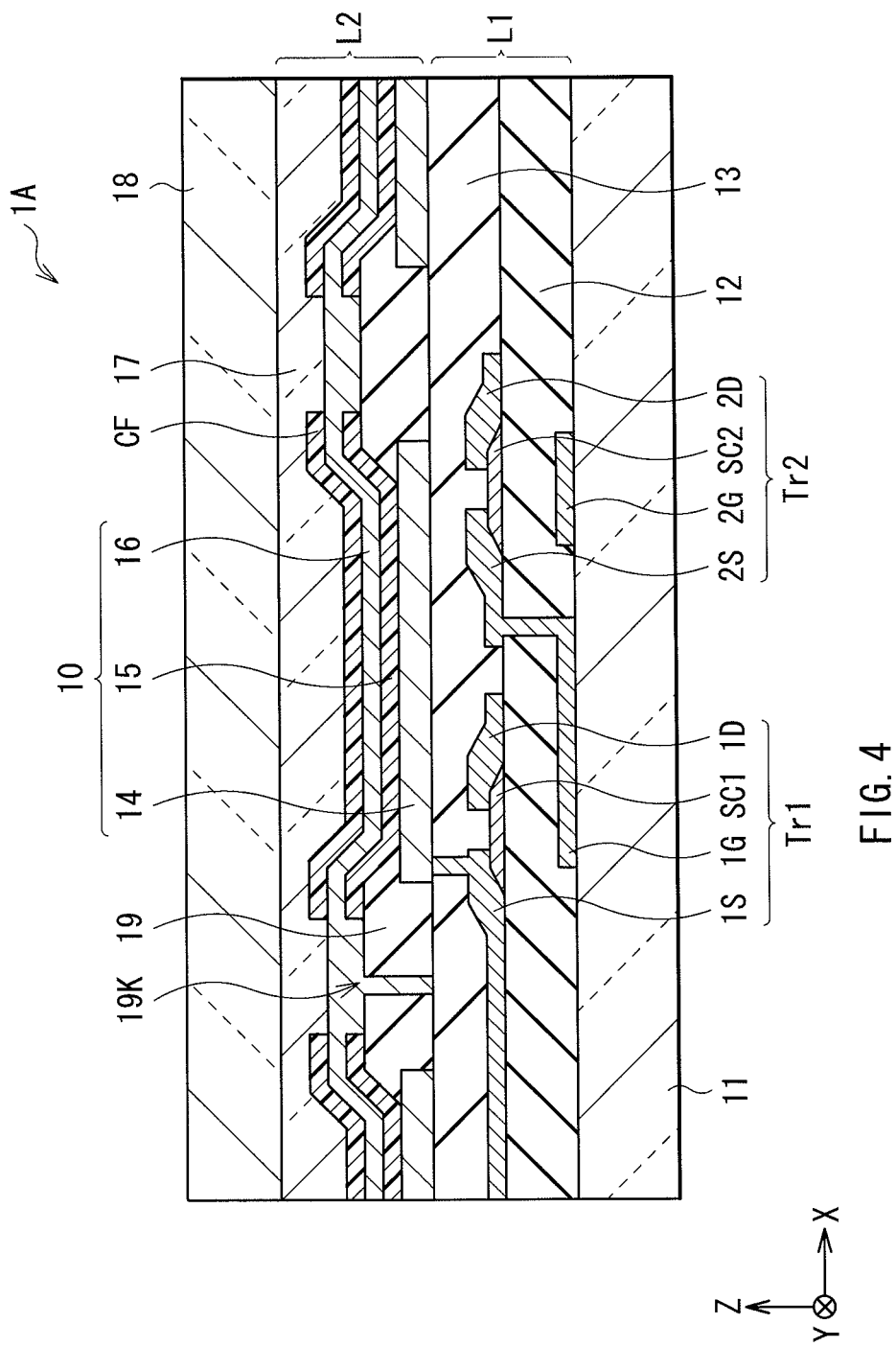
FIG. 4 is a cross-sectional view illustrating a configuration of a display unit as a second embodiment of the present application.

FIG. 4 illustrates a cross-sectional configuration of a main section of a display unit 1A including an organic light emitting device as a second embodiment of the present application, and corresponds to FIG. 1 in the foregoing first embodiment. In the display unit 1 of the first embodiment, light emitting color of the organic light emitting device 10 is changed by changing the component material of the organic layer 15. Meanwhile, in the display unit 1A of this embodiment, light emitting color of the organic light emitting device 10 is white, each color filter is selectively formed therein, and thereby each color is displayed. Except for such a point, the display unit 1A has a configuration similar to that of the display unit 1.

In forming the display unit 1A, formation to the point of forming the second electrode 16 is made in a manner similar to that of the display unit 1. After that, a color filter CF with a desired color is selectively formed by using an evaporation method and a photolithography method. It is enough that the color filter CF has a size with which a region where the first electrode 14, the organic layer 15, and the second electrode 16 are overlapped is covered, and white light is not leaked to the opposed substrate 18 side. After forming the color filter CF, the sealing layer 17 is formed. Finally, the sealing layer 17 is bonded to the opposed substrate 18 with the adhesive layer in between. Thereby, the display unit 1A is completed.

In such a display unit 1A, effects similar to those of the foregoing first embodiment are obtained.

The present application has been described with reference to several embodiments. However, the present application is not limited to the foregoing embodiments, and various modifications may be made. For example, in the foregoing embodiments, the description has been given of the display unit using the top-emission type organic light emitting device. However, the present application is applicable to a bottom-emission type organic EL display unit as well.

Figure 5:
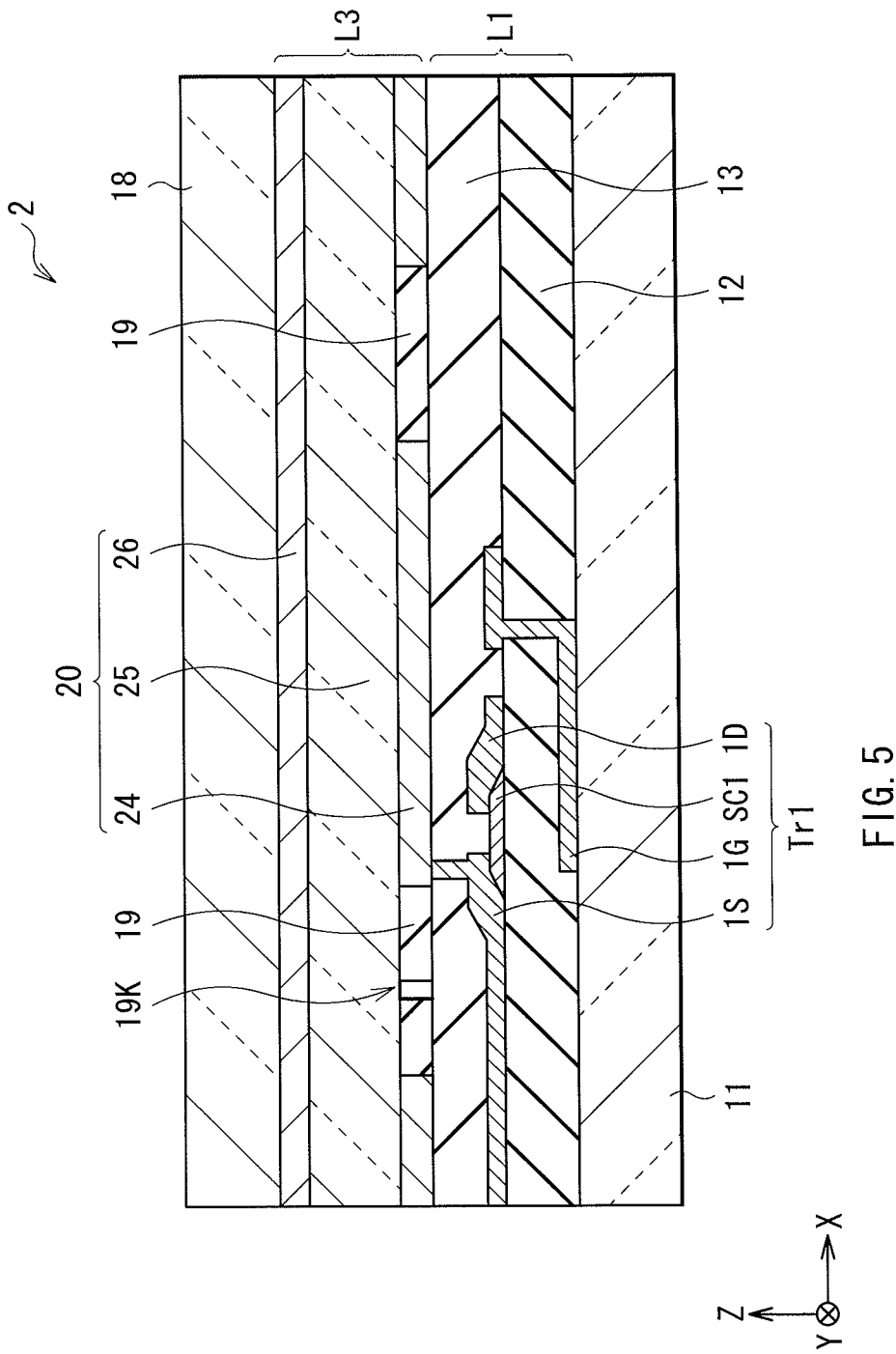
FIG. 5 is a cross-sectional view illustrating a configuration of a display unit as a modification of the present application.

Further, in the foregoing embodiments, the description has been given of the display unit using the organic light emitting device as an example. However, this technology is applicable to a display unit 2 including a liquid crystal display device as illustrated in FIG. 5, for example. In the display unit 2, for example, the pixel drive circuit formation layer L1 described in the foregoing embodiment, a liquid crystal device formation layer L3 including a liquid crystal display device 20, and the opposed substrate 18 are sequentially layered on the supporting substrate 11. The liquid crystal display device 20 has a first electrode 24 as a pixel electrode selectively formed on the protective layer 13, a second electrode 26 as a counter electrode, and a liquid crystal layer 25 inserted therebetween. Both the first electrode 24 and the second electrode 26 are made of a transparent conductive material such as ITO. Further, the kind of liquid crystal molecule contained in the liquid crystal layer 25 may be arbitrarily selected. The first electrode 24 is separated by the black insulating layer 19 as well. Further, in the insulating layer 19, a plurality of openings 19K are provided in a predetermined position as in the foregoing embodiment. In the display unit 2 using such a liquid crystal display device 20, effects similar to those of the foregoing embodiments are obtained.

Thus, it is possible to achieve at least the following configurations from the above-described example embodiments of the disclosure.

(1) A display unit including, on a substrate:

a plurality of light emitting devices in which a first electrode, an organic layer including a light emitting layer, and a second electrode are respectively and sequentially layered; and a black insulating layer separating the organic layer for the every light emitting device.

(2) The display unit according (1), wherein the substrate is made of a flexible material.

(3) The display unit according (1) or (2) further including:

a drive circuit between the substrate and the plurality of light emitting devices, the drive circuit driving the plurality of light emitting devices, wherein the black insulating layer includes an opening.

(4) The display unit according (3) including:

an opposed substrate facing the substrate with the plurality of light emitting devices, the black insulating layer, and the drive circuit in between.

(5) The display unit according (3), wherein the drive circuit includes a thin film transistor including an organic semiconductor layer.

(6) The display unit according any one of (1) to (5), wherein the black insulating layer is made of a photosensitive resin in which a black colorant, a black dye, and a black pigment are dispersed.

(7) The display unit according (6), wherein the black colorant is carbon black.

(8) A substrate for display unit used for a display unit together with a plurality of display devices, the substrate for display unit including:

a drive circuit driving the plurality of display devices; and a black insulating layer separating a region on the drive circuit into a plurality of display regions respectively corresponding to the plurality of display devices.

(9) The substrate for display unit according to (8), wherein the black insulating layer includes an opening.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A display unit comprising, on a substrate:
   a plurality of light emitting devices in which a first electrode, an organic layer including a light emitting layer, and a second electrode are respectively and sequentially layered; and
   a black insulating layer separating the organic layer for the every light emitting device, wherein the black insulating layer includes an opening disposed adjacent to an opening in the organic layer of the display unit.

2. The display unit according claim 1, wherein the substrate is made of a flexible material.

3. The display unit according claim 1, further comprising:
   a drive circuit between the substrate and the plurality of light emitting devices, the drive circuit driving the plurality of light emitting devices.

4. The display unit according claim 3, further comprising:
   an opposed substrate facing the substrate with the plurality of light emitting devices, the black insulating layer, and the drive circuit in between.

5. The display unit according claim 3, wherein the drive circuit includes a thin film transistor including an organic semiconductor layer.

6. The display unit according claim 1, wherein the black insulating layer is made of a photosensitive resin in which a black colorant, a black dye, and a black pigment are dispersed.

7. The display unit according claim 6, wherein the black colorant is carbon black.

8. The display unit according claim 1, wherein the opening of the black insulating layer is provided in the vicinity of at least one intersection of one or more of the following: (i) a signal line, (ii) a scanning line, and (iii) a power source supply line.

9. A substrate for a display unit used for a display unit together with a plurality of display devices, the substrate for a display unit comprising:
   a drive circuit driving the plurality of display devices; and
   a black insulating layer separating a region on the drive circuit into a plurality of display regions respectively corresponding to the plurality of display devices, wherein the black insulating layer includes an opening disposed adjacent to an opening in an organic layer of the display unit.

10. The substrate for the display unit according to claim 9, wherein the opening of the black insulating layer is provided in the vicinity of at least one intersection of one or more of the following: (i) a signal line, (ii) a scanning line, and (iii) a power source supply line.

11. The substrate for the display unit according to claim 9, wherein the substrate is made of a flexible material.

12. The substrate for the display unit according to claim 9 further comprising:
   a drive circuit between the substrate and a plurality of light emitting devices, the drive circuit driving the plurality of light emitting devices.

13. The substrate for the display unit according to claim 12, further comprising:
   an opposed substrate facing the substrate with the plurality of light emitting devices, the black insulating layer, and the drive circuit in between.

14. The substrate for the display unit according to claim 12, wherein the drive circuit includes a thin film transistor including an organic semiconductor layer.

15. The substrate for the display unit according to claim 9, wherein the black insulating layer is made of a photosensitive resin in which a black colorant, a black dye, and a black pigment are dispersed.

16. The substrate for the display unit according to claim 15, wherein the black colorant is carbon black.

\* \* \* \* \*